(12) United States Patent
Wang et al.

(10) Patent No.: US 6,727,112 B2
(45) Date of Patent: Apr. 27, 2004

(54) BURIED HETERO-STRUCTURE OPTO-ELECTRONIC DEVICE

(75) Inventors: Zhi-Jie Wang, Arcadia, CA (US); Soo-Jin Chua, Singapore (SG); Fan Zhou, Beijing (CN); Wei Wang, Beijing (CN)

(73) Assignee: Agency for Science, Technology and Research, Centros (SG)

( * ) Notice: Subject to any disclaimer, the term of this patent is extended or adjusted under 35 U.S.C. 154(b) by 0 days.

(21) Appl. No.: 09/931,647

(22) Filed: Aug. 16, 2001

(65) Prior Publication Data

US 2002/0074600 A1 Jun. 20, 2002

(30) Foreign Application Priority Data

Aug. 16, 2000 (SG) ........................ 200004523-7

(51) Int. Cl.[7] .................... H01L 21/00; H01L 27/15; H01L 31/12; H01L 31/153
(52) U.S. Cl. .................... 438/40; 438/39; 257/85
(58) Field of Search .................... 372/43; 257/79, 257/85, 103, 87; 438/29, 39, 40, 42

(56) References Cited

U.S. PATENT DOCUMENTS

| | | | | |
|---|---|---|---|---|
| 4,213,805 A | * | 7/1980 | Tsukada | 438/40 |
| 5,196,958 A | * | 3/1993 | Verbeek et al. | 359/344 |
| 5,594,751 A | * | 1/1997 | Scott | 372/46 |
| 5,879,961 A | * | 3/1999 | Scott | 438/32 |
| 5,903,589 A | * | 5/1999 | Jewell | 372/46 |
| 5,936,266 A | * | 8/1999 | Holonyak et al. | 257/106 |
| 6,022,760 A | * | 2/2000 | Lebby et al. | 438/123 |
| 6,269,109 B1 | * | 7/2001 | Jewell | 372/43 |
| 6,282,009 B1 | * | 8/2001 | Tada et al. | 359/248 |
| 6,287,884 B1 | * | 9/2001 | Jie et al. | 438/39 |
| 6,343,487 B1 | * | 2/2002 | Chen | 62/620 |
| 6,500,687 B2 | * | 12/2002 | Takei et al. | 438/39 |
| 2001/0050934 A1 | * | 12/2001 | Choquette et al. | 372/43 |

OTHER PUBLICATIONS

S. Wolf and R.N. Tauber, Silicon Processing for the VLSI Era, Copyright 1986, by Lattice Press, vol. 1, pp. 171 and 183.*

* cited by examiner

Primary Examiner—Erik J. Kielin
Assistant Examiner—William Vesperman
(74) Attorney, Agent, or Firm—Ladas & Parry

(57) ABSTRACT

A method of manufacturing a semiconductor optical device comprising the steps of: providing a substrate having an active layer thereon; providing an aluminium-bearing layer, the aluminium bearing layer being adjacent the active layer; and oxidising the aluminium-bearing layer substantially entirely.

40 Claims, 3 Drawing Sheets

Figure 1:
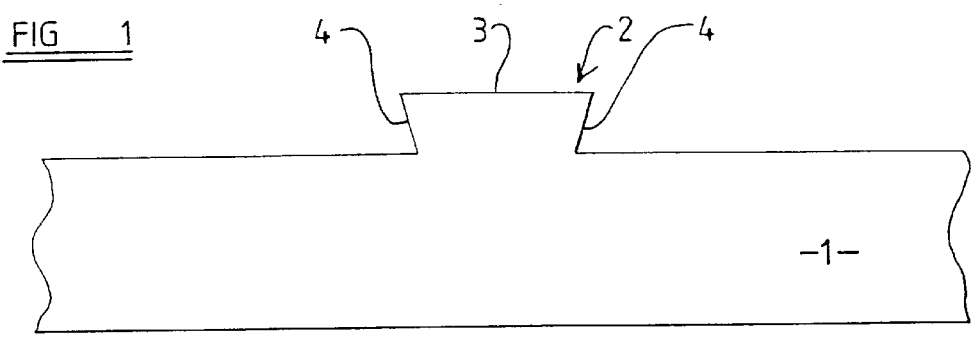

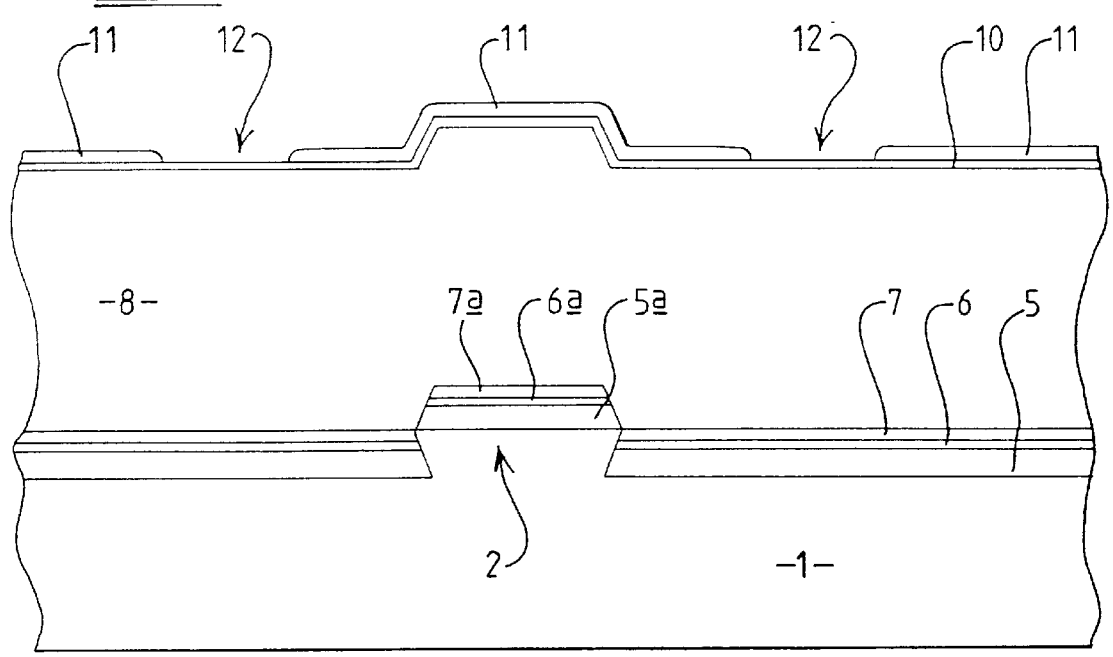
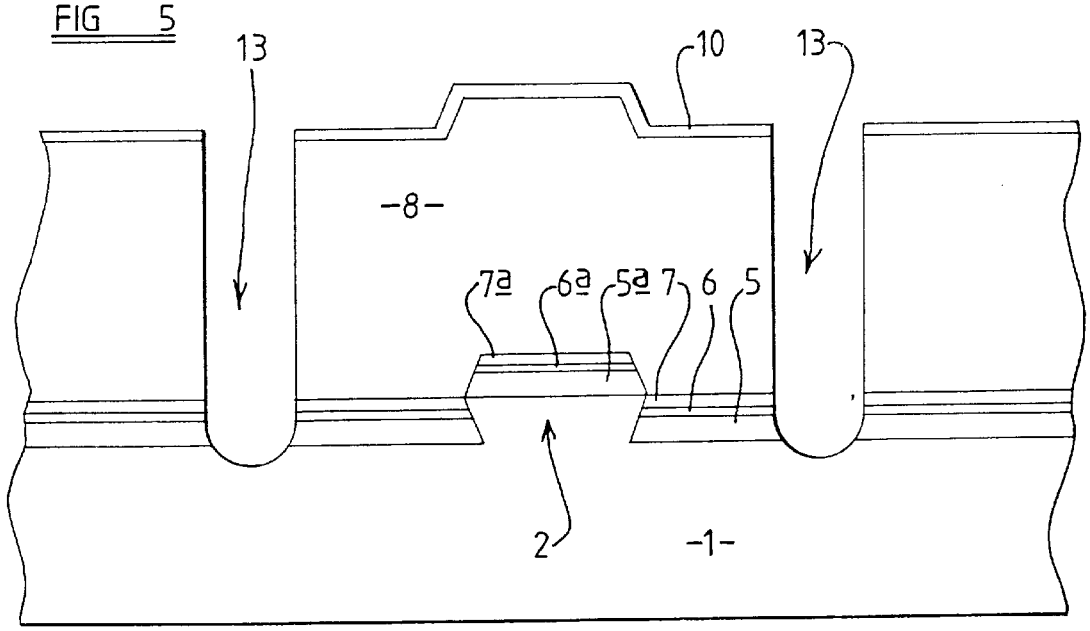

BURIED HETERO-STRUCTURE OPTO-ELECTRONIC DEVICE

THIS INVENTION relates to buried hetero-structure opto-electronic devices, and in particular to buried hetero-structure semiconductor lasers.

Buried hetero-structure semiconductor lasers have become widely-used in recent years as laser sources for, for example, optical communication systems. In a conventional buried hetero-structure semiconductor laser, an active layer (i.e. the layer in which the photons constituting the laser are actually generated) of a semiconductor material is buried within a larger bandgap semiconductor material. Semiconductor layers surrounding the active layer are grown to create a reverse biased junction, the active layer being positioned in a gap in the reverse biased junction. In operation of the device, electrical current flows across the semiconductor layers, substantially perpendicularly thereto. The reverse biased junction provides resistance to this, and the flow of current is directed through the gap in the reverse-biased junction, and hence through the active layer.

This structure does, however, suffer from drawbacks, in that, under high temperature and high output power operation, the flow of current across the device can be sufficient to drive electrons across the reversed biased junction, thereby drastically reducing the effectiveness of the device.

A further drawback of the above-described semiconductor laser is that the conventional fabrication process of such a device is rather complicated, as sufficient layers of appropriately doped semiconductor material to create a p-n-p-n thyristor must be grown in the correct order during manufacture of the device.

It is an object of the present invention to seek to alleviate some or all of these disadvantages.

Accordingly, one aspect of the present invention provide a method of manufacturing a semiconductor optical device comprising the steps of:
  providing a substrate having an active layer thereon;
    providing an aluminium-bearing layer, the aluminium bearing layer being adjacent the active layer; and
    oxidising the aluminium-bearing layer substantially entirely.

Advantageously, the method further comprises the step of providing a mesa on the substrate and wherein the step of providing an active layer comprises the step of providing an active layer on the mesa.

Preferably, the step of providing a mesa on the substrate comprises the steps of: providing a substrate; and wet etching the substrate to form a mesa.

Conveniently, the step of providing a mesa on the substrate comprises the steps of: providing a substrate; and reactive ion etching the substrate to form a mesa.

Advantageously, the method further comprises the step of etching at least one groove in the device to a depth at least equal to that of the aluminium-bearing layer.

Preferably, the step of etching at least one groove in the device comprises the steps of: providing an etching mask an upper surface of the device, the etching mask having an elongate gap therein; and applying an etching process to the device.

Conveniently, the method further comprises the step of providing at least one further groove in the device, the at least one further groove being substantially parallel to the first groove.

Advantageously, the method further comprises the step of providing a cladding layer on top of the active layer or the aluminium-bearing layer.

Preferably, the method further comprises the step of providing a contact layer on the uppermost layer of the device.

Conveniently, the method further comprises the step of providing a first electrode on the device.

Advantageously, the method further comprises the step of providing a second electrode on an opposite side of the device from the first electrode.

Preferably, the step of providing an aluminium-bearing layer or the step of providing an active layer comprises the step of growth by a low pressure metal-organic vapour phase epitaxial technique.

Conveniently, the method further comprises the step of depositing a dielectric film on a layer of the device.

Advantageously, the step of depositing a dielectric film comprises the step of deposition by a plasma chemical vapour deposition method.

Preferably, the step of oxidising the aluminium-bearing layer substantially entirely comprises the step of heating the device in water-containing environment at a temperature of about 350 to 550° C.

Conveniently, the water-containing environment is generated by the flow of a gas through water heated to about 80 to 90° C. for about half an hour to about 10 hours.

A further aspect of the present invention provides a semiconductor optical device comprising: a substrate having an active layer formed thereon; and an aluminium-bearing layer, wherein the aluminium-bearing layer is adjacent the active layer and is oxidised substantially entirely.

Advantageously, a mesa is formed on the substrate, the active layer being located on the mesa.

Preferably, the device further comprises first and second electrodes on opposing sides thereof.

Conveniently, the device further comprises a cladding layer provided on the active layer or the aluminium-bearing layer.

Advantageously, the aluminium-bearing layer is substantially continuous apart from the region of the substrate on which the active layer is formed, thereby allowing electric current to flow from a first side of the device to a second side of the device only through the active layer.

In order that the present invention may be more readily understood, embodiments thereof will now be described, by way of example, and with reference to the accompanying drawings, in which:

FIGS. 1 to 6 show first to sixth stages in the fabrication of an opto-electric device embodying the present invention.

Turning firstly to FIG. 1, the first step in the manufacture of a device embodying the present invention is the provision of a n-(negatively doped) InP substrate 1 which is preferably formed on a semiconductor material. The doping concentration of the substrate 1 is preferably in the region of $10^{18}$ $cm^{-3}$. The substrate 1 is etched to provide a mesa 2, in the form of an elongated, raised strip, along the <110> direction of the substrate. The height of the mesa is preferably less than 2 $\mu$m, and the width of the mesa is preferably in the region of 2-2.5 $\mu$m. A top surface 3 of the mesa 2 is substantially parallel to that of the substrate 1, and the side walls 4 of the mesa 2 preferably subtend an angle equal to or less than 90° with the surface of the etched substrate 1. The etching of the mesa may be achieved by the use of a two-step wet etching Br mixture followed by a $Hbr:H_3PO_4$ mixture. Alternatively, reactive ion etching (employing, for example, $CH_4/H_2$) could be used. However, it will be clear to a person skilled in the art that many techniques may be employed for the creation of the mesa 2.

Figure 2:
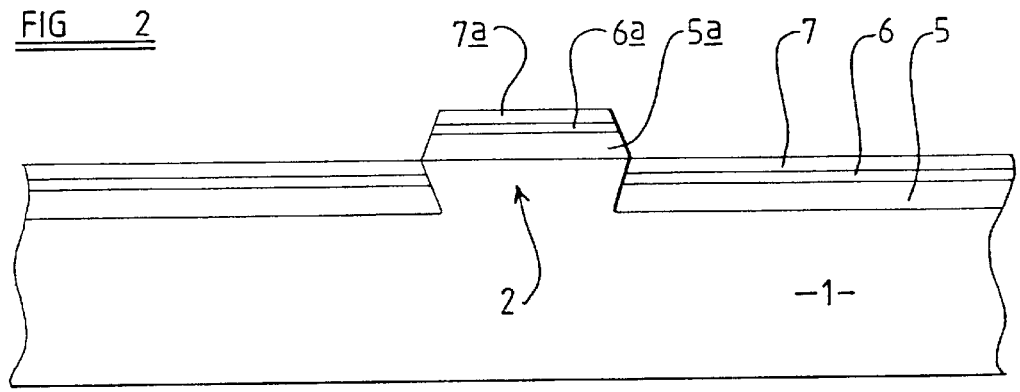

A buffer layer 5, which is preferably formed of n-InP semiconductor material, is then grown on the substrate 1, as shown in FIG. 2. The doping concentration of the buffer layer 5 is preferably in the region of $8*10^{18}$cm$^{-3}$. The depth of the buffer layer 5 is less than the height of the mesa 2, so that a top portion of the mesa 2 protrudes above the buffer layer 5. A separate portion 5a of the buffer layer 5 is deposited on the top surface 3 of the mesa 2, however the separate portion 5a has no contact with the remainder of the buffer layer 5. The depth of the buffer layer 5 is preferably in the region of 0.3 μm.

Following the deposition of the buffer layer 5, an active layer 6, which preferably comprises InGaAsP semiconductor material, and an aluminium-bearing layer 7 are formed on the buffer layer 5 as shown in FIG. 2. The aluminium-bearing material is preferably formed of $Al_xGa_yIn_{/-x-y}As$ bulk, $Al_xGa_yIn_{/-x-y}As/Al_xGa_yIn_{/-x-y}$ (x being in the range of >0.4 and y being between 0 and 1) mixed multiple layers or AlAsSb semiconductor material. The upper surface of the aluminium-bearing layer 7 is, after deposition on the buffer layer 5 and the active layer 6, approximately equal in height to the upper surface 3 of the mesa 2.

As the active layer 6 and the aluminium-bearing layer 7 are deposited on the buffer layer 5, central portions 6a, 7a, of these layers will be deposited on top of the central region of the buffer layer 5a on top of the mesa 2, the central portions 6a, 7a being approximately equal in thickness to those deposited on the main region of the substrate 1. The central portions 6a, 7a of the active layer 6 and the aluminium-bearing layer 7 are grown separately from the portions of these layers grown on the main region of the substrate 1, due to A preferential crystal regrowth mechanism. The materials comprising the active layer 6 and the aluminium-bearing layer 7 will not grow on the (111)B facets of the mesa 2 (i.e. the side surfaces thereof), and so the regions of these materials grown on the top surface 3 of the mesa 2 are physically separate from those grown on the main region of the substrate 1.

Figure 3:
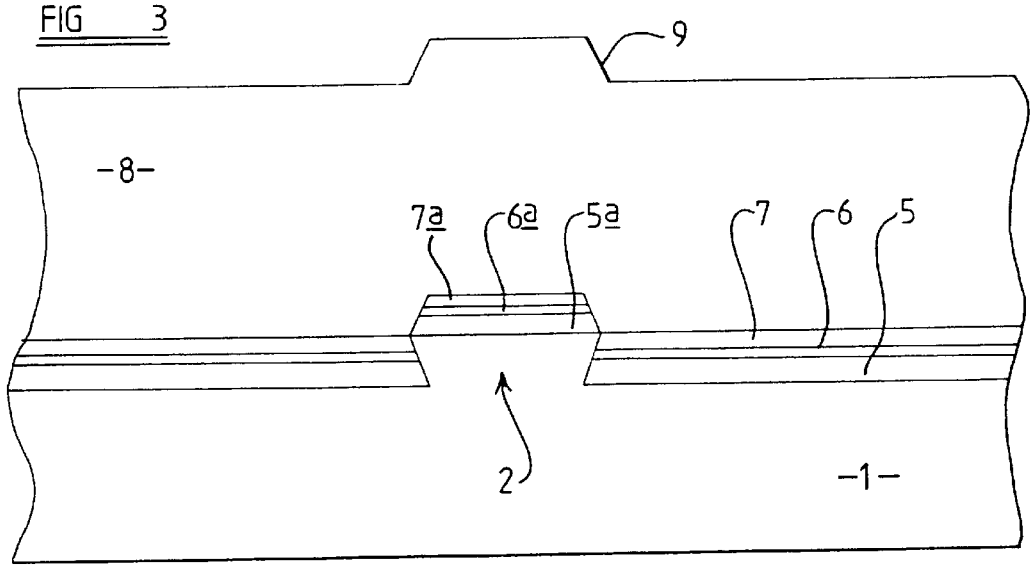

Next, a cladding layer 8, which is preferably formed of p-InP semiconductor material, is deposited on top of the previously-formed layers. The doping concentration of the cladding layer 8 is preferably in the region of $5*10^{17}$cm$^{-3}$. The cladding layer 8 is of significantly greater thickness than the buffer layer 5, the active layer 6, or the aluminium-bearing layer 7, and a relatively great depth of the cladding layer 8 is formed over these layers. The presence of the raised mesa 2 and the central portions of the buffer layer 5a, active layer 6a and aluminium-bearing layer 7a formed thereon lead to a central bulge 9 in the top of the cladding layer 8, due to even deposition of this layer over the uneven surface of the previously-formed layers. A p-InGaAs contact layer 10 is grown on the upper surface of the cladding layer 8. The cladding layer 8 and contact layer 10 are shown in FIG. 3.

An oxidation protection mask 11, which is preferably formed of $S:O_2$ or $S:_3N_4$, is subsequently formed on top of the contact layer 10. The oxidation protection mask 11 is formed to cover substantially the entire upper surface of the contact layer 10, with the exception of two narrow stripes 12, the stripes 12 being substantially parallel with the mesa 2 and one stripe 12 being either side of the mesa 2 as shown in FIG. 4. Etching of the top surface of the deposited layers is then performed.

Due to the presence of the oxidation protection mask 11, only the two stripes 12 of exposed contact layer may be etched. Etching continues until two parallel grooves 13, corresponding to the positions of the two stripes 12, are formed through all the deposited layers, and penetrate the top surface of the substrate 1. The parallel grooves are preferably formed by wet etching, the etching solution being Br or HCl based. FIG. 5 shows the layers once the two grooves 13 have been formed therein. It will be appreciated that a surface of each of the deposited layers 5, 6, 7, 8, 10 will be exposed on a wall of each of the grooves 13. The walls of the grooves 13 may be substantially perpendicular to the deposited layers (as shown in FIG. 5), however this need not be the case, and the walls may be inclined in either direction.

The next step in the process is to utilise a native oxidation technique to oxidise the aluminium-bearing layer 7. The oxidation is preferably carried out by heating the device in a water-containing environment at a temperature of around 350 to 550° C. Such a moist environment may be generated by flowing a gas, for example, nitrogen, through water heated to about 80 to 90° C. The flow of water vapour is continued for about half an hour to ten hours. The oxidation process continues until substantially all of the aluminium-bearing layer 7 has been oxidised. Clearly, the atmosphere above the device cannot come into contact with the portions of the buffer layer 5a, the active layer 6a and the aluminium-bearing layer 7a that were deposited on the top surface 3 of the mesa 2, as these layers are contained within the cladding layer 8. Hence, the portion of the aluminium-bearing layer 7a that was deposited on the top surface 3 of the mesa 2 does not become oxidised. In a preferred embodiment of the invention, the aluminium-bearing layer 7 has a concentration in the region of $5*10^{17}$Al atoms cm$^{-3}$. A high concentration of aluminium expedites the oxidation process, thereby shortening the production time of the device.

Figure 6:
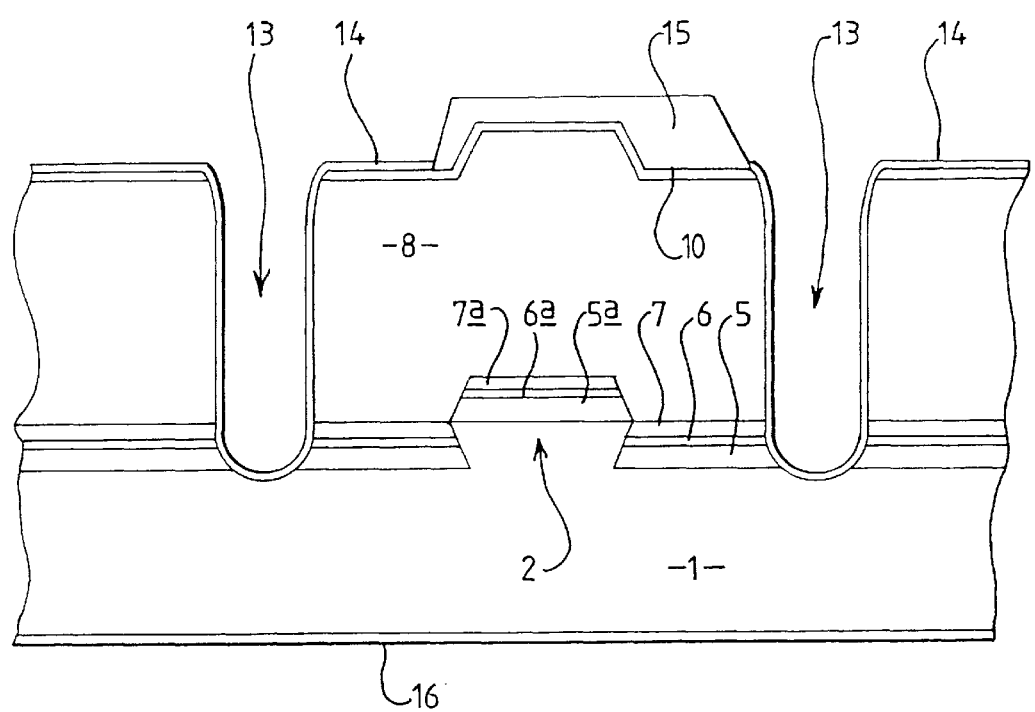

In the final stage of the manufacturing process, a dielectric film 14 is deposited over the majority of the upper surface of the contact layer 10. The only region of the contact layer 10 that is not covered by the dielectric film 14 is the bulge 9 on the top surface of the contact layer 10 directly above the mesa 2, and a region to one side thereof. A layer of a conductive metal 15 is deposited on the region of the contact layer 10 that is not covered by the dielectric film 14, as shown in FIG. 6. A further layer of conductive metal 16 is applied to the lower surface of the substrate 1.

Preferably, the above-mentioned epitaxial semiconductor layers are grown by a low pressure metal-organic vapour phase epitaxy (mOVPE) technique. The dielectric film is preferably deposited by a plasma chemical vapour deposition (CVD) method. However, the present invention is not limited to these methods.

In use of the finished device, a current is applied to the device, and made to flow from the positive electrode thereof (formed by the layer of conductive metal 15 on the top surface of the contact layer 10) to the negative electrode thereof (formed by the layer of conductive metal 16 formed on the lower surface of the substrate 1). Current-carrying electrons pass through the contact layer 10 and the cladding layer 8. However the electrons are not able to pass through the oxidised aluminium-bearing layer 7, due to the dielectric properties of oxidised aluminium. As a consequence, the vast majority of the current-carrying electrons are forced to pass through the layers 5a, 6a, 7a formed on the top surface 3 of the mesa 2. Due to the fact that the portion of the aluminium-bearing layer 7a deposited on the top surface 3 of the mesa 2 is not oxidised, this layer 7a does not block the electrons and allows them to pass into the active layer 6a formed on the top surface 3 of the mesa 2. After having passed through the active layer 6a, the current-carrying electrons pass through the part of the buffer layer 5a that is deposited on the mesa 2, through the substrate 1 and into the negative electrode formed by the layer of conductive metal 16 deposited on the lower surface of the substrate 1.

As the electrons pass through the active layer 6a, excitation and de-excitation events between well-defined energy levels in the active layer 6a lead to the emission of photons of a particular wavelength, giving rise to a laser beam which may leave the device through an end of the active layer 6a. The active layer 6a is, preferably, small enough to support only a single transverse mode of the laser photons. Due to the concentration of the current flowing through the device by the oxidised aluminium-bearing layer 7 through the active layer 6a, the device has a low lasing current threshold. In addition, the fact that the oxidised aluminium-bearing layer 7 blocks the passage of current therethrough by virtue of the insulating properties thereof (rather than providing a reverse-biased semiconductor junction) the above-mentioned drawback of the provision of such junctions (i.e. the driving of electrons across the junction at high operating currents and temperatures) will not occur.

Further advantages are conferred by the structure of the device of the present invention, in that oppositely-doped semiconductor layers are required to form a reversed-biased semiconductor junction. In contrast, only one layer need be deposited to form an insulating oxidised aluminium-bearing layer, and devices embodying the present invention may be manufactured with fewer epitaxial deposition steps than conventional semiconductor lasers. A reduction in the number of epitaxial deposition steps is highly desirable, as these steps are difficult to control and time-consuming to perform.

The present invention may be employed to construct DFB lasers, DBR lasers, FP lasers, optical amplifiers, waveguides, switches or other integrated devices, and is not limited to the above embodiment.

It will be clear to a person skilled in the art that the present invention allows the construction of semiconductor lasers with low lasing thresholds and which perform consistently at high operating temperatures and currents. The present invention also allows the construction of such high-quality semiconductor lasers with fewer epitaxial deposition steps, leading to a significant reduction in the time and cost required to construct the device.

In the present specification "comprises" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A method of manufacturing a semiconductor optical device comprising the steps of:
   providing a substrate having an active layer thereon;
   providing a mesa on the substrate;
   providing an aluminum-bearing layer adjacent and contacting the active layer, the aluminum-bearing layer comprising a first aluminum-bearing layer portion on the mesa and a second aluminum-bearing portion beside the mesa; and
   oxidizing the second aluminum-bearing layer portion without oxidizing the first aluminum-bearing layer portion.

2. A method according to claim 1, wherein the active layer comprises a first active layer portion on the mesa and a second active layer portion beside the mesa.

3. A method according to claim 1, wherein the step of providing a mesa on the substrate comprises the steps of:
   providing a substrate; and
   wet etching the substrate to form a mesa.

4. A method according to claim 1, wherein the step of providing a mesa on the substrate comprises the steps of:
   providing a substrate; and
   reactive ion etching the substrate to form a mesa.

5. A method according to claim 1, further comprising the step of etching at least one groove in the device to a depth at least equal to that of the second aluminum-bearing portion.

6. A method according to claim 5, wherein the step of etching at least one groove in the device comprises the steps of:
   providing an etching mask on an upper surface of the device, the etching mask having an elongate gap therein; and
   applying an etching process to the device.

7. A method according to claim 5, further comprising the step of providing at least one further groove in the device, the at least one further groove being substantially parallel to the first groove.

8. A method according to claim 1, further comprising the step of providing a cladding layer on top of the active layer or the aluminum-bearing layer.

9. A method according to claim 1, further comprising the step of providing a contact layer on the uppermost layer of the device.

10. A method according to claim 1, further comprising the step of providing a first electrode on the device.

11. A method according to claim 10, further comprising the step of providing a second electrode on an opposite side of the device from the first electrode.

12. A method according to claim 1, wherein the step of providing an aluminum-bearing layer or the step of providing an active-layer comprises the step of growth by a low pressure metal-organic vapour phase epitaxial technique.

13. A method according to claim 1, further comprising the step of depositing a dielectric film on a layer of the device.

14. A method according to claim 13, wherein the step of depositing a dielectric film comprises the step of deposition by a plasma chemical vapour deposition method.

15. A method according to claim 1, wherein the step of oxidizing the second aluminum-bearing layer portion comprises the step of heating the device in water-containing environment at a temperature of about 350 to 550° C.

16. A method according to claim 15, wherein the water-containing environment is generated by the flow of a gas through water heated to about 80 to 90° C. for about half an hour to about 10 hours.

17. A semiconductor optical device comprising:
   a substrate having an active layer formed thereon;
   a mesa on the substrate; and
   an aluminum-bearing layer adjacent and contacting the active layer, the aluminum-bearing layer comprising a nonoxidized aluminum-bearing layer portion on the mesa and an oxidized aluminum-bearing layer portion beside the mesa.

18. A device according to claim 17, wherein the active layer comprises a first active layer portion on the mesa and a second active layer portion beside the mesa.

19. A device according to claim 17, further comprising first and second electrodes on opposing sides thereof.

20. A device according to claim 17, further comprising a cladding layer provided on the active layer or the aluminum-bearing layer.

21. A device according to claim 17, wherein the aluminum-bearing layer is substantially continuous apart from the region of the substrate on which the active layer is formed, thereby allowing electric current to flow from a first side of the device to a second side of the device only through an active layer.

22. A buried heterostructure optical device comprising:

a substrate having a mesa region;

an active layer having a first active layer portion on the mesa region and second and third active layer portions on the substrate beside the mesa region, the second and third active layer portions being separate from the first active layer portion;

an aluminum-bearing layer having a first aluminum-bearing layer portion on the first active layer portion, the first aluminum-bearing layer portion being a non-oxidized portion, and second and third aluminum-bearing layer portions on the second and third active layer portions, the second and third aluminum-bearing layer portions being oxidized portions and separate from the first aluminum-bearing layer portion; and at least one groove, extending in the device to a depth at least equal to that of second and third aluminum-bearing layer portions, whereby the second and third aluminum-bearing layer portions are current-blocking portions, current being allowed to flow through the first active layer portion to allow photonic emission by means of the first active layer portion.

23. The optical device of claim 22, further comprising a buffer layer separating the active layer from the substrate.

24. The optical device of claim 23, wherein the buffer layer comprises a first buffer layer portion separating the first active layer portion from the substrate, a second buffer layer portion separating the second active layer portion from the substrate, and a third buffer layer portion separating the third active layer portion from the substrate.

25. The optical device of claim 23, wherein the mesa region has a depth not inferior to the combined depth of the buffer layer, the active layer, and the aluminum-bearing layer.

26. The optical device of claim 22, further comprising a cladding layer grown on the aluminum-bearing layer.

27. The optical device of claim 26, further comprising a contact layer grown on the cladding layer.

28. The optical device of claim 27, wherein the contact layer is an InGaAs contact layer.

29. The optical device of claim 26, wherein the cladding layer is a p-InP cladding layer.

30. The optical device of claim 22, wherein the substrate is an n-InP substrate.

31. The optical device of claim 22, wherein the mesa region is a strip mesa region.

32. The optical device of claim 31, wherein the strip mesa region is along a <110> direction.

33. The optical device of claim 22, wherein the at least one groove are two grooves.

34. The optical device of claim 33, wherein the two grooves are parallel to each other.

35. The optical device of claim 22, wherein the mesa region is etched by means of wet etching.

36. The optical device of claim 22, wherein the mesa region is etched by means of reactive ion etching.

37. The optical device of claim 22, wherein the mesa region has a depth of less than 2 $\mu$m.

38. The optical device of claim 22, wherein the active layer comprises InGaAsP.

39. The optical device of claim 22, wherein the Aluminum-bearing layer is chosen from a group comprising AlInAs, AlInGaAs and AlAsSb.

40. The optical device of claim 22, wherein the active layer and the aluminum-bearing layer are grown by means of a metal-organic vapor phase epitaxy (MOVPE) technique.

* * * * *